(12) United States Patent
Luo et al.

(10) Patent No.: US 12,494,444 B2
(45) Date of Patent: Dec. 9, 2025

(54) SEMICONDUCTOR DEVICE WITH TUNABLE ANTENNA USING WIRE BONDS

(71) Applicant: Micron Technology, Inc., Boise, ID (US)

(72) Inventors: Shijian Luo, Boise, ID (US); Owen R. Fay, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 561 days.

(21) Appl. No.: 17/578,103

(22) Filed: Jan. 18, 2022

(65) Prior Publication Data
US 2022/0140468 A1    May 5, 2022

Related U.S. Application Data

(63) Continuation of application No. 16/118,670, filed on Aug. 31, 2018, now Pat. No. 11,251,516.

(51) Int. Cl.
*H01L 23/66* (2006.01)
*H01L 23/00* (2006.01)
*H01Q 1/22* (2006.01)
*H04B 1/38* (2015.01)

(52) U.S. Cl.
CPC .............. *H01L 23/66* (2013.01); *H01L 24/49* (2013.01); *H01Q 1/2283* (2013.01); *H04B 1/38* (2013.01); *H01L 2223/6677* (2013.01); *H01L 2224/4903* (2013.01); *H01L 2924/01013* (2013.01); *H01L 2924/01029* (2013.01); *H01L 2924/01047* (2013.01); *H01L 2924/01079* (2013.01)

(58) Field of Classification Search
CPC . H01L 23/66; H01L 24/49; H01L 2223/6611; H01L 2223/6677; H01Q 1/2283
See application file for complete search history.

(56) References Cited

U.S. PATENT DOCUMENTS

| 2009/0115041 | A1* | 5/2009 | Igarashi | H01L 23/66 |
| | | | | 257/679 |
| 2015/0002229 | A1* | 1/2015 | Kuo | H03F 1/0288 |
| | | | | 438/107 |
| 2016/0197400 | A1 | 7/2016 | Zimmerman et al. | |
| 2018/0190612 | A1* | 7/2018 | Ndip | H01L 23/49838 |
| 2020/0076051 | A1 | 3/2020 | Luo et al. | |

* cited by examiner

*Primary Examiner* — Raj R Gupta
(74) *Attorney, Agent, or Firm* — Dorsey & Whitney LLP

(57) ABSTRACT

A semiconductor device, or semiconductor device package, that includes a substrate having an antenna structure on a surface of the substrate and a wire bond that electrically connects the antenna structure to the substrate to form an antenna or a first antenna configuration. The substrate may include a second antenna structure with the wire bond connected to the second antenna structure forming a second antenna or antenna configuration. The semiconductor device may include a radio communication device electrically connected to the substrate. The antenna or antenna configuration may be tuned to the requirements of the radio communication device. The antenna configuration may be tuned by connected to different antenna structures on the surface of the substrate. The antenna configuration may be tuned by changing a length of the wire bond, changing a diameter of the wire bond, and/or changing the material of the wire bond.

20 Claims, 5 Drawing Sheets

SEMICONDUCTOR DEVICE WITH TUNABLE ANTENNA USING WIRE BONDS

CROSS-REFERENCE TO RELATED APPLICATION(S)

This application is a continuation of U.S. application Ser. No. 16/118,670, filed Aug. 31, 2018, now U.S. Pat. No. 11,251,516; which is incorporated herein by reference in its entirety.

FIELD

The embodiments described herein relate to millimeter wave antennas and, in particular, wire bonds on a semiconductor device that form part of an antenna, which may be a millimeter wave antenna.

BACKGROUND

As computing devices become more integrated into society, data access and mobility is becoming more important to a typical consumer. Compact wireless computing devices, such as cell phones, tablets, laptops, etc., are becoming faster, smaller, and more mobile. In order to meet the demands of new generation products, processing and memory packages within mobile devices must become faster and more compact. 5th Generation Wireless Systems (5G) provide high throughput, low latency, high mobility, and high connection density. Making use of millimeter wave bands (24-86 GHz) for mobile data communication is beneficial for producing 5G systems.

Antennas used for millimeter wave communication typically include an antenna array deposited on a printed circuit board (PCB) within a mobile device. The area, or real estate, available to be occupied by an antenna decreases as the density of devices attached to the PCB increases, which may result in larger, less mobile devices. Further, a horizontal millimeter wave antenna may cause interference to adjacent circuitry, over which the antenna may be deposited. These factors can make it difficult to incorporate millimeter wave antennas into mobile devices. Other disadvantages may exist.

Figure 1:
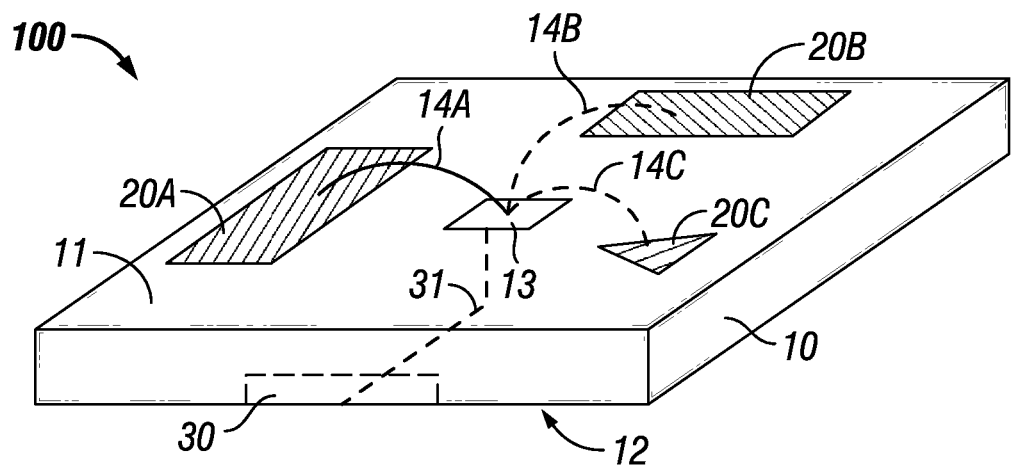
FIG. 1 is a schematic of an embodiment of a semiconductor device with a tunable antenna.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, wafer form and/or panel form. The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment of the disclosure, a semiconductor device comprises a substrate having a first surface and a second surface opposite the first surface. The semiconductor comprises a first antenna structure on the first surface of the substrate and a first wire bond that electrically connects the first antenna structure to the substrate to form an antenna.

One embodiment is a semiconductor device comprising a substrate having a first surface and a second surface opposite the first surface. The semiconductor device comprises a first antenna structure on the first surface of the substrate and a second antenna structure on the first surface of the substrate. The semiconductor device comprises a radio communication device electrically connected to the substrate and a first wire bond. The substrate has a first antenna configuration when the first wire bond is connected between the first surface of the substrate and the first antenna structure and the substrate has a second antenna configuration when the first wire bond is connected between the first surface of the substrate and the second antenna structure.

One embodiment is a method of providing a tunable antenna comprising providing a first antenna structure on a surface of a semiconductor device. The method comprises connecting a wire bond between the first antenna structure and the semiconductor device to provide an antenna that is tunable. The antenna may be tunable in various ways as discussed herein.

FIG. 1 is a schematic of an embodiment of a semiconductor device 100 with a tunable antenna that comprises a wire bond 14A connected to a first antenna structure 20A on a first, or top, surface, 11 of a substrate 10. The first surface 11 is opposite a second surface 12 of the substrate 10. The wire bond 14A connects the first antenna structure 20A to a pad 13 on the first surface 11 of the semiconductor device 100. The pad 13 provides for an electrical connection to the substrate 10 as would be appreciated by one of ordinary skill in the art having the benefit of this disclosure. The semiconductor device 100 may include a radio communication device 30, such as a transmitter, a receiver, a transceiver, or another type of radio communication device, positioned within the substrate 10 that may be connected to the antenna formed by the first wire bond 14A and the first antenna structure 20A via connection 31 as shown in FIG. 1.

The radio communication device 30 may be configured for millimeter wave communication and may incorporate 5G systems. The radio communication device 30 may be coupled to the substrate 10 or alternatively may be on a separate semiconductor device electrically connected to the semiconductor device 100 as would be appreciated by one of ordinary skill in the art having the benefit of this disclosure.

The semiconductor device 100 may include a second antenna structure 20B and third antenna structure 20C located on the first surface 11 of the substrate 10. The first, second, and third antenna structures 20A-20C are shown on the first surface 11 of the substrate 10 for illustrative purposes and may be positioned on a surface of a semiconductor device package, surface of a semiconductor device assembly, and/or on the surface of packaging material of a semiconductor device package as would be appreciated by one of ordinary skill in the art having the benefit of this disclosure.

The antenna of the semiconductor device 100 is tunable by various mechanism as discussed herein. Generally, the antenna of the semiconductor device 100 is tunable by modifying the overall total area of the antenna, which includes the wire bond and the antenna structure, as discussed herein. The antenna of the semiconductor device 100 may be tuned depending on the requirements of the radio communication device 30. The antenna of the semiconductor device 100 may be tuned by connecting the pad 13 to a second antenna structure 20B with a second wire bond 14B (shown in dash) instead of connecting the pad 13 to the first antenna structure 20A with the first wire bond 14A. Likewise, the antenna of the semiconductor device 100 may be tuned by connecting the pad 13 to a third antenna structure 20C with a third wire bond 14C (shown in dash) instead of connecting the pad 13 to the first antenna structure 20A with the first wire bond 14A.

Alternatively, the antenna of the semiconductor device 100 may be tuned by connecting the radio communication device 30 to multiple antenna structures 20A-20C on the first surface 11 of the substrate 10. For example, a first wire bond 14A may connect the pad 13 to the first antenna structure 20A while a second wire bond 14B connects the pad 13 to second antenna structure 20B. Any two of the antenna structures 20A-20C may be connected to the radio communication device 30 at the same time or all three of the antenna structures 20A-20B may be connected to the radio communication device 30 as would be recognized by one of ordinary skill in the art having the benefit of this disclosure. The size, number, shape, and/or configuration of the pad 13, wire bonds 14A-14C, and/or antenna structures 20A-20C are shown in FIG. 1 for illustrative purpose and may be varied depending on the application as would be appreciated by one of ordinary skill in the art having the benefit of this disclosure.

Figure 2A:
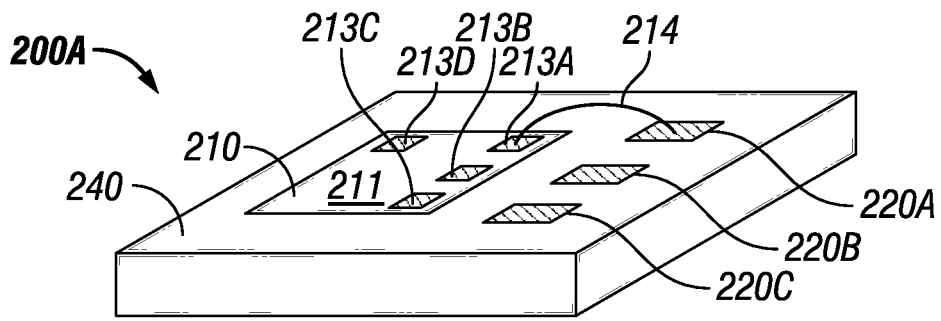
FIG. 2A is a schematic of an embodiment of a semiconductor device package with a tunable antenna.

FIG. 2A is a schematic of an embodiment of a semiconductor device package 200A with a tunable antenna having a first antenna configuration. The semiconductor device package 200A includes a semiconductor device 210 and packaging material 240, which may be, but is not limited to, mold compound. The semiconductor device 210 includes a plurality of pads 213A-213D located on a first, or top, surface 211. Each of the pads 213A-213D may be connected to a radio communication device enabling each of the pads 213A-213D to connect an antenna to the radio communication device as discussed herein. The number, size, location, shape, and/or configuration of the pads 213A-213D is shown for illustrative purposes and may be varied depending on the application as would be appreciated by one of ordinary skill in the art having the benefit of this disclosure. For example, the first surface 211 of the semiconductor device 210 may include less than or more than the four pads 213A-213D shown in FIG. 2A.

The semiconductor device assembly 200A includes antenna structures 220A-220C located on the surface of the packaging material 240. The number, size, location, and/or configuration of the antenna structures 220A-220C is shown for illustrative purposes and may be varied depending on the application as would be appreciated by one of ordinary skill in the art having the benefit of this disclosure. For example, a surface of the packaging material 240 may include less than or more than the three antenna structures 220A-220C shown in FIG. 2A. In FIG. 2A, the tunable antenna comprises a first antenna structure 220A and the wire bond 214 that extends from pad 213A to the first antenna structure 220A. The antenna of the semiconductor device assembly 200A is tunable by varying the total area of the antenna as shown in FIGS. 2B-2D with respect to FIG. 2A.

Figure 2B:
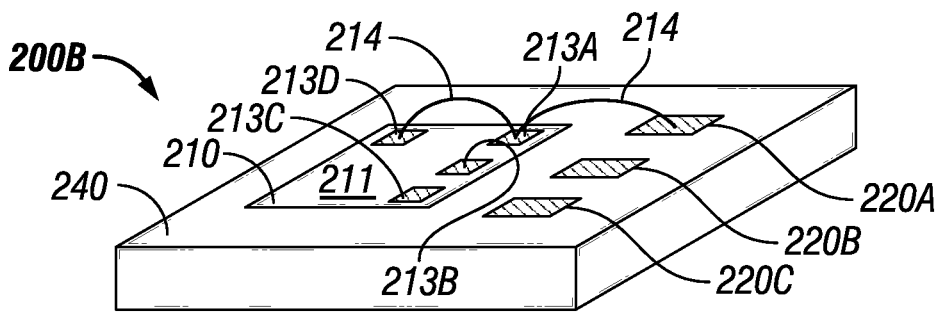
FIG. 2B is a schematic of an embodiment of a semiconductor device package with a tunable antenna.

FIG. 2B is a schematic of an embodiment of a semiconductor device package 200B with a tunable antenna having a second antenna configuration. The antenna of the semiconductor device package 200B of FIG. 2B comprises the wire bond 214 that stretches in between pad 213D and 213A as well as the first antenna structure 220A and the wire bond 214 that extends from pad 213A to the first antenna structure 220A. The additional length of wire bond 214 between pads 213D and 213A permits the antenna to be tuned differently with respect to the antenna of FIG. 2A. The use of two lengths of wire bond 214 enables the antenna of the semiconductor device package 200B to be tuned to a configuration that differs from the antenna configuration of FIG. 2A.

Figure 2C:
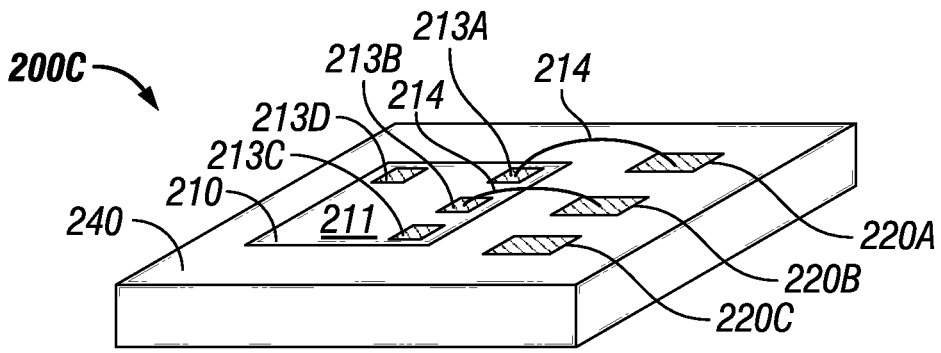
FIG. 2C is a schematic of an embodiment of a semiconductor device package with a tunable antenna.

FIG. 2C is a schematic of an embodiment of a semiconductor device package 200C with a tunable antenna having a third antenna configuration. The antenna of the semiconductor device package 200C of FIG. 2C comprises the first antenna structure 220A and the wire bond 214 that extends from pad 213A to the first antenna structure 220A as well as a second antenna structure 220B and the wire bond 214 that extends between pad 213B and the second antenna structure 220B. The use of two antenna structures 220A, 220B and two lengths of wire bond 214 enables the antenna of the semiconductor device package 200C to be tuned to a configuration that differs from the antenna configurations of FIGS. 2A and 2B.

Figure 2D:
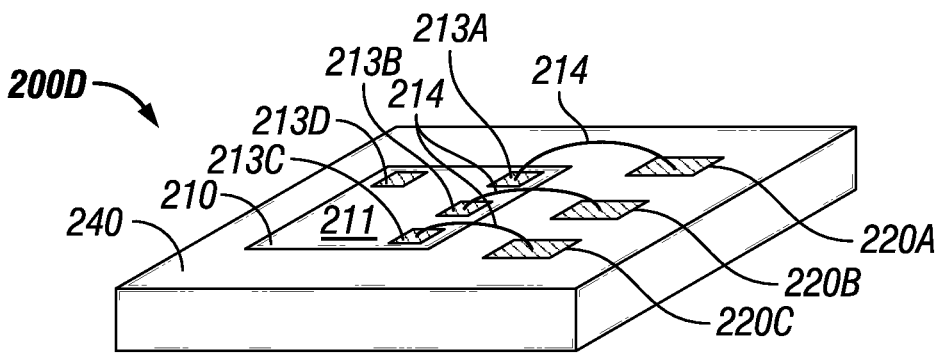
FIG. 2D is a schematic of an embodiment of a semiconductor device package with a tunable antenna.

FIG. 2D is a schematic of an embodiment of a semiconductor device package 200D with a tunable antenna having a fourth antenna configuration. The antenna of the semiconductor device package 200D of FIG. 2D comprises the first antenna structure 220A and the wire bond 214 that extends from pad 213A to the first antenna structure 220A, the second antenna structure 220B and the wire bond 214 that extends between pad 213B and the second antenna structure 220B, and a third antenna structure 220C and the wire bond 214 that extends between 213C and the third antenna structure 220C. The use of three antenna structures 220A, 220B, 220C and three lengths of wire bond 214 enables the antenna of the semiconductor device package 200D to be tuned to a configuration that differs from the antenna configurations of FIGS. 2A, 2B, and 2C.

The antenna configurations of FIGS. 2A-2D are shown for illustrative purposes and various antenna configurations may be provided by varying the lengths of the wire bonds 214, number of connected antenna structures 220A-220C, shape of the antenna structures 200A-200C, location of the antenna structures 200A-200C, and/or the size of the antenna structures 200A-200C depending on the application as would appreciated by one of ordinary skill in the art having the benefit of this disclosure.

Figure 3:
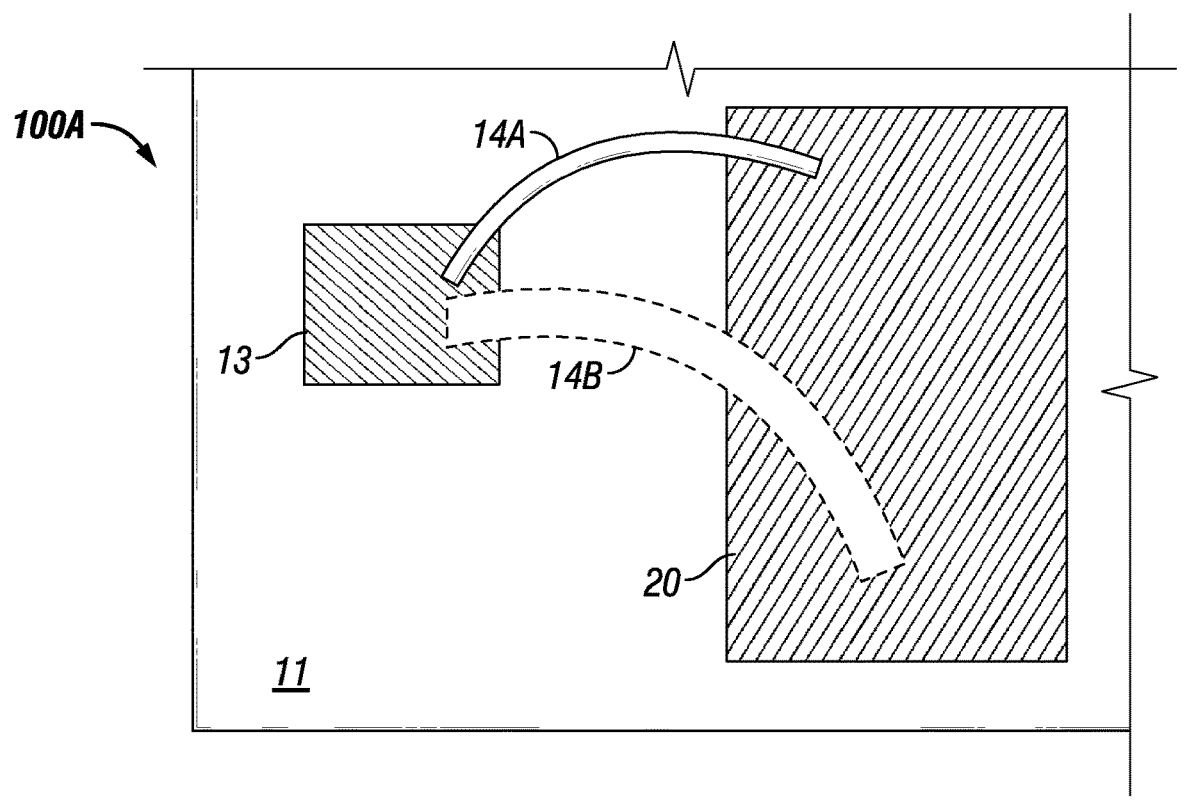
FIG. 3 is a close-up view schematic of an embodiment of a semiconductor device with a tunable antenna.

FIG. 3 is a close-up view schematic of surface 11 of an embodiment of a semiconductor device 100A with a tunable antenna. The surface 11 includes a pad 13 and an antenna structure 20. The number, size, configuration, shape, and/or location of the pad 13 and antenna structure 20 is shown for illustrative purpose and may be varied depending on the application as would be appreciated by one of ordinary skill in the art having the benefit of this disclosure. The antenna of the semiconductor device 100A comprises the antenna structure 20 and the wire bond 14A that extends between the antenna structure 20 and the pad 13. The antenna may be tuned by changing the diameter of the wire bond 14A that extends between the pad 13 and the antenna structure 20. For example, a wire bond 14B (shown in dash) having a larger diameter may be used to connect the antenna structure 20 with the pad 13. The use of a larger or smaller diameter wire bond 14A, 14B enables the antenna configuration of the semiconductor device 100A to be tunable as would be appreciated by one of ordinary skill in the art having the benefit of this disclosure.

Figure 4:
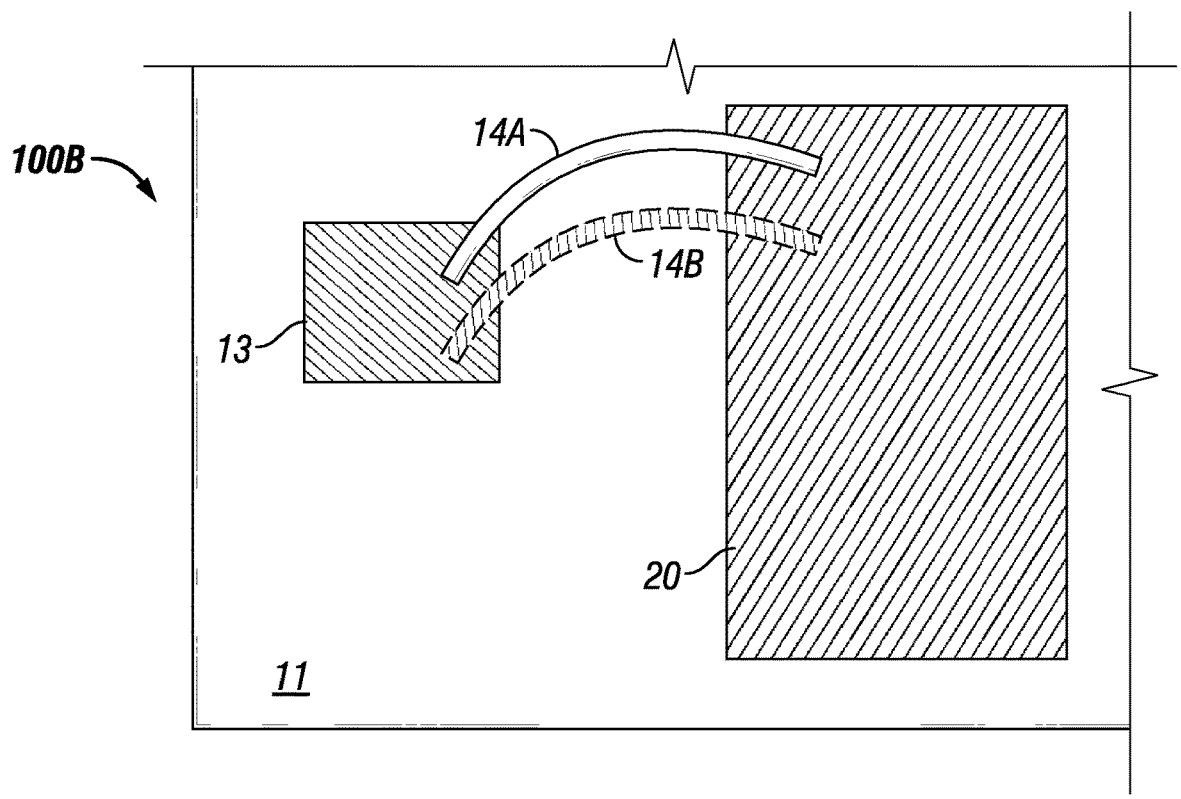
FIG. 4 is a close-up view schematic of an embodiment of a semiconductor device with a tunable antenna.

FIG. 4 is a close-up view schematic of surface 11 of an embodiment of a semiconductor device 100B with a tunable antenna. The surface 11 includes a pad 13 and an antenna structure 20. The number, size, configuration, shape, and/or location of the pad 13 and antenna structure 20 is shown for illustrative purposes and may be varied depending on the application as would be appreciated by one of ordinary skill in the art having the benefit of this disclosure. The antenna of the semiconductor device 100B comprises the antenna structure 20 and the wire bond 14A that extends between the antenna structure 20 and the pad 13. The antenna may be tuned by changing the material of the wire bond 14A that extends between the pad 13 and the antenna structure 20. For example, a wire bond 14B (shown in dash) comprised of a different material may be used to connect the antenna structure 20 with the pad 13. Wire bonds 14 of various materials may be used. For example, the wire bond 14 may be, but is not limited to, gold, copper, silver, or aluminum. The use of different materials for the wire bond 14A, 14B enables the antenna configuration of the semiconductor device 100B to be tunable as would be appreciated by one of ordinary skill in the art having the benefit of this disclosure.

Figure 5:
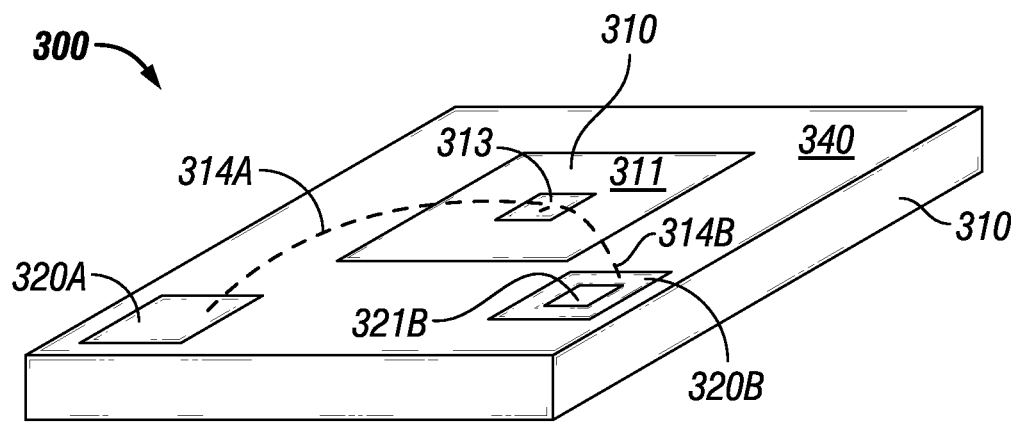
FIG. 5 is a schematic of an embodiment of a semiconductor device package with a tunable antenna.

FIG. 5 is a schematic of an embodiment of a semiconductor device package 300 with a tunable antenna. The semiconductor device package 300 includes a semiconductor device 310 and packaging material 340, which may be, but is not limited to, mold compound. The semiconductor device 310 includes at least one pad 313 located on a first, or top, surface 311. The pad 313 may be connected to a radio communication device enabling the pad 313 to connect an antenna to the radio communication device as discussed herein. The number, size, location, shape, and/or configuration of the pad 313 is shown for illustrative purposes and may be varied depending on the application as would be appreciated by one of ordinary skill in the art having the benefit of this disclosure. For example, the first surface 311 of the semiconductor device 310 may include more than one pads 313 as shown in FIG. 5.

The semiconductor device package 300 includes antenna structures 320A and 320B located on the surface of the packaging material 340. The first antenna structure 320A may be comprised of a first shape and the second antenna structure 320B may be comprised of a similar or nearly identical shape, but may include an opening 321B within a portion of the second antenna structure 320B as shown in FIG. 5. The difference in shape between the two antenna structures 320A and 320B enables the antenna of the semiconductor device assembly 300 to be tunable. For example, a wire bond 314A connecting pad 313 to the first antenna structure 320A provides a first antenna configuration. Likewise, a wire bond 314B connecting pad 313 to the second antenna structure 320B provides a second antenna configuration as the total area of the second antenna configuration differs from the total area of the first antenna configuration. The number, size, location, shape, and/or configuration of the antenna structures 320A and 320B is shown for illustrative purposes and may be varied depending on the application as would be appreciated by one of ordinary skill in the art having the benefit of this disclosure.

Figure 6:
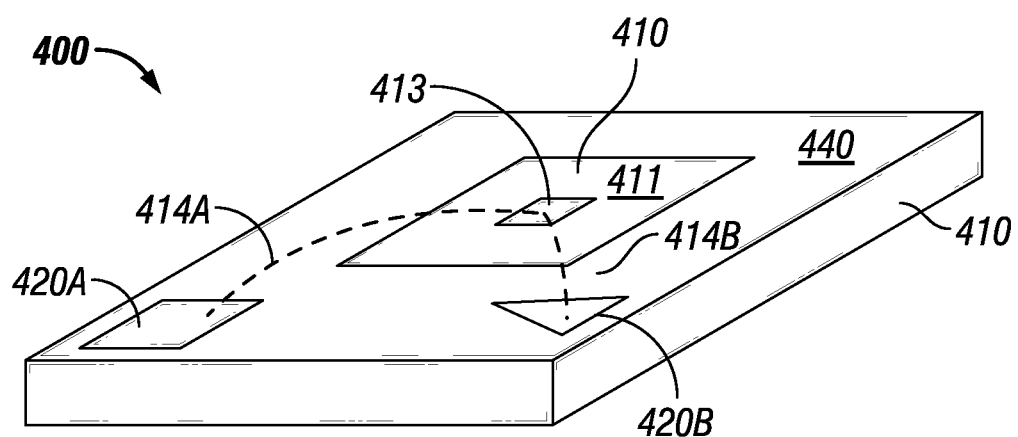
FIG. 6 is a schematic of an embodiment of a semiconductor device package with a tunable antenna.

FIG. 6 is a schematic of an embodiment of a semiconductor device package 400 with a tunable antenna. The semiconductor device package 400 includes a semiconductor device 410 and packaging material 440, which may be, but is not limited to, mold compound. The semiconductor device 410 includes at least one pad 413 located on a first, or top, surface 411. The pad 413 may be connected to a radio communication device enabling the pad 413 to connect an antenna to the radio communication device as discussed herein. The number, size, location, shape, and/or configuration of the pad 413 is shown for illustrative purposes and may be varied depending on the application as would be appreciated by one of ordinary skill in the art having the benefit of this disclosure. For example, the first surface 411 of the semiconductor device 410 may include more than one pads 413 as shown in FIG. 6.

The semiconductor device package 400 includes antenna structures 420A and 420B located on the surface of the packaging material 440. The first antenna structure 420A may be comprised of a first shape having a first area. The second antenna structure 420B may be comprised of a different shape having a second area that is similar or nearly to the first area of the first antenna structure. The difference in shape between the two antenna structures 420A and 420B even though the two antenna structures 420A and 420B having roughly the same area may enable the antenna of the semiconductor device assembly 400 to be tunable. For example, a wire bond 414A connecting pad 413 to the first antenna structure 420A provides a first antenna configuration. Likewise, a wire bond 414B connecting pad 413 to the second antenna structure 420B provides a second antenna configuration. The number, size, location, shape, and/or configuration of the antenna structures 420A and 420B is shown for illustrative purposes and may be varied depending on the application as would be appreciated by one of ordinary skill in the art having the benefit of this disclosure.

Figure 7:
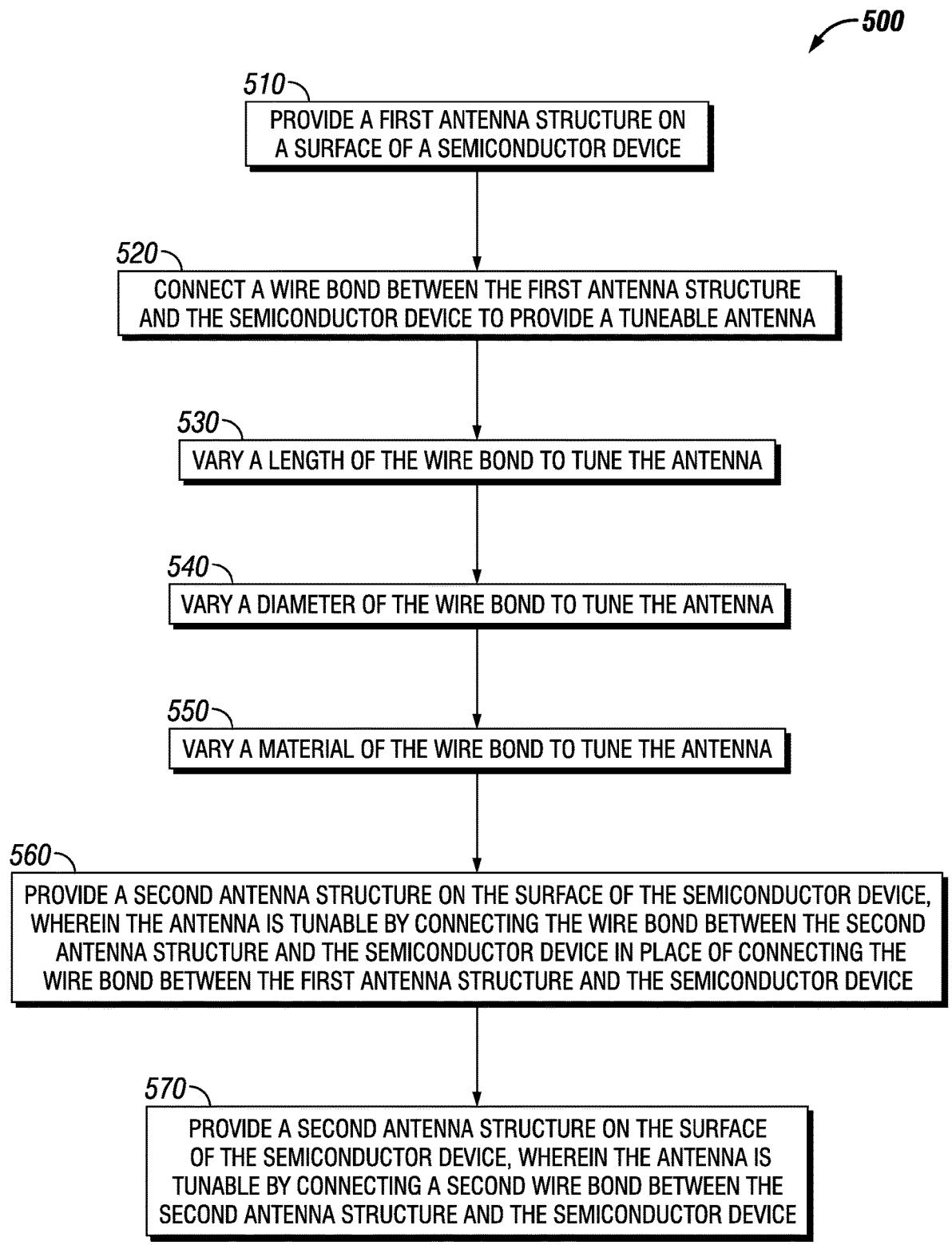
FIG. 7 is a flow chart depicting an embodiment of a method of providing a tunable antenna.

FIG. 7 is a flow chart depicting an embodiment of a method 500 of providing a tunable antenna. The method 500 comprises providing a first antenna structure on a surface of a semiconductor device, at 510. The surface of the semiconductor device may include more than one antenna structure. For example, antenna structures 20A and/or 20B may be provided on a first side 11 of a semiconductor device as shown in FIG. 1. Antenna structures 320A, 320B may also be provided onto packaging material 340 of a semiconductor device package 300 as shown in FIG. 5. The method 500 include connecting a wire bond between the first antenna structure and the semiconductor device to provide an antenna that is tunable, at 520. The first antenna structure may be one of various antenna structures on the surface of the semiconductor device or on the surface of a semiconductor device package.

The method 500 may include varying a length of the wire bond to tune the antenna, at 530. For example, a wire bond connecting a first pad on the surface of a semiconductor device to the first antenna structure may provide a first antenna configuration and a wire bond connecting a second pad on the surface of the semiconductor device to the first antenna structure may provide a second antenna configuration due to the different lengths of the wire bonds.

The method 500 may include varying a diameter of the wire bond to tune the antenna, at 540. For example, a wire bond connecting a first pad on the surface of a semiconductor device to an antenna structure may provide a first antenna configuration and a wire bond having a different diameter connecting the pad to the first antenna structure may provide a second antenna configuration due to the different diameters of the wire bonds.

The method 500 may include varying a material of the wire bond to tune the antenna, at 550. For example, a wire bond of a first material connecting a first pad on the surface of a semiconductor device to an antenna structure may provide a first antenna configuration and a wire bond of a second material connecting the pad to the first antenna structure may provide a second antenna configuration due to the different properties of the materials of the wire bonds.

The method 500 may include providing a second antenna structure on the surface of the semiconductor device, wherein the antenna is tunable by connecting the wire bond between the second antenna structure and the semiconductor device in place of connecting the wire bond between the first antenna structure and the semiconductor device, at 560. As discussed herein, providing different antenna structures on a surface of the semiconductor device enables tuning of an antenna configuration. The method 500 may include providing a second antenna structure on the surface of the semiconductor device, wherein the antenna is tunable by connecting a second wire bond between the second antenna structure and the semiconductor device, at 570. As discussed herein, the connecting the semiconductor to multiple antenna structure enables the tuning to a different antenna configuration.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A semiconductor device package comprising:
   a semiconductor device; and
   an antenna, comprising:
   a plurality of pads disposed on a first surface of the semiconductor device,
   a plurality of antenna structures, and
   a plurality of wire bonds that electrically connect at least one of the plurality of pads to at least one of the plurality of antenna structures and that each directly couple to two pads of the plurality of pads.

2. The semiconductor device package of claim 1, wherein the semiconductor device is electrically connected to a first antenna structure of the plurality of antenna structures via a first pad of the plurality of pads and a first wire bond of the plurality of wire bonds.

3. The semiconductor device package of claim 2, further comprising a second wire bond that electrically connects the first pad and a second pad of the plurality of pads, the second wire bond stretching in between the first pad and the second pad.

4. The semiconductor device package of claim 2, further comprising a third wire bond that electrically connects a second antenna structure of the plurality of antenna structures and a third pad of the plurality of pads.

5. The semiconductor device package of claim 4, further comprising a fourth wire bond that electrically connects a third antenna structure of the plurality of antenna structures and a fourth pad of the plurality of pads.

6. The semiconductor device package of claim 4, further comprising a fifth wire bond that electrically connects the first antenna structure and the second antenna structure.

7. The semiconductor device package of claim 1, wherein a performance characteristic of the antenna is dependent upon a length, a diameter, and/or a material of the plurality of wire bonds.

8. The semiconductor device package of claim 1, wherein the plurality of wire bonds are made of gold, silver, copper, or aluminum.

9. The semiconductor device package of claim 1, further comprising a packaging material with a second surface.

10. The semiconductor device package of claim 9, wherein the semiconductor device is embedded in the packaging material, and the first surface of the semiconductor device and the second surface of the packaging material are coplanar.

11. The semiconductor device package of claim 1, wherein the plurality of antenna structures have a first antenna structure with a first area and a second antenna structure with a second area, the first area being differ from the second area.

12. The semiconductor device package of claim 11, wherein the first antenna structure has a first shape and the second antenna structure has a second shape that differs from the first shape.

13. A semiconductor device package comprising:
a semiconductor device having a first surface and embedded in a packaging material having a second surface coplanar with the first surface; and
an antenna, comprising:
 a plurality of pads disposed on the first surface of the semiconductor device,
 a plurality of antenna structures disposed on the second surface of the packaging material,
 a first wire bond that electrically connects a first pad of the plurality of pads to a first antenna structure of the plurality of antenna structures, and
 a second wire bond that directly couples to and that electrically connects the first pad and a second pad of the plurality of pads.

14. The semiconductor device package of claim 13, wherein the semiconductor device is electrically connected to the first antenna structure via the first pad, the second pad, the first wire bond, and the second wire bond.

15. The semiconductor device package of claim 13, further comprising a third wire bond that electrically connects a third pad of the plurality of pads and a second antenna structure of the plurality of antenna structures.

16. The semiconductor device package of claim 15, further comprising a fourth wire bond that electrically connects a fourth pad of the plurality of pads and a third antenna structure of the plurality of antenna structures.

17. The semiconductor device package of claim 14, wherein a performance characteristic of the antenna is dependent upon a length, a diameter, and/or a material of the first wire bond and the second wire bond.

18. The semiconductor device package of claim 14, further comprising a fifth antenna structure disposed on the second surface of the packaging material, the fifth antenna structure having a shape different to the first antenna structure.

19. The semiconductor device package of claim 18, further comprising a fifth wire bond that electrically connects the first pad to the fifth antenna structure, wherein the performance characteristic of the antenna is also dependent upon a length, a diameter, and/or a material of the fifth wire bond.

20. A semiconductor device package comprising:
a semiconductor device having a first surface and embedded in a packaging material having a second surface coplanar with the first surface; and
an antenna, comprising:
 a plurality of pads disposed on the first surface of the semiconductor device,
 an antenna structure disposed on the second surface of the packaging material, and
 a plurality of wire bonds that electrically connect at least one of the plurality of pads to the antenna structure and that each directly couple to two pads of the plurality of pads, wherein a performance characteristic of the antenna is dependent upon a length, a diameter, and/or a material of the plurality of wire bonds.

* * * * *